(12) United States Patent
Rodriguez-Amaya et al.

(10) Patent No.: US 9,766,290 B2
(45) Date of Patent: Sep. 19, 2017

(54) METHOD FOR OPERATING A SWITCHING ELEMENT

(75) Inventors: Nestor Rodriguez-Amaya, Stuttgart (DE); Siegfried Ruthardt, Altdorf (DE); Holger Rapp, Ditzingen (DE); Wolfgang Stoecklein, Waiblingen (DE); Bernd Berghaenel, Illingen (DE); Marco Beier, Stuttgart-Feuerbach (DE)

(73) Assignee: ROBERT BOSCH GMBH, Stuttgart (DE)

( * ) Notice: Subject to any disclaimer, the term of this patent is extended or adjusted under 35 U.S.C. 154(b) by 683 days.

(21) Appl. No.: 13/880,834

(22) PCT Filed: Oct. 12, 2011

(86) PCT No.: PCT/EP2011/067782
§ 371 (c)(1),
(2), (4) Date: May 31, 2013

(87) PCT Pub. No.: WO2012/059304
PCT Pub. Date: May 10, 2012

(65) Prior Publication Data
US 2013/0257439 A1    Oct. 3, 2013

(30) Foreign Application Priority Data

Nov. 3, 2010   (DE) .................... 10 2010 043 303
Dec. 21, 2010  (DE) .................... 10 2010 063 681

(51) Int. Cl.
*G01R 31/327*  (2006.01)
*F02D 41/20*   (2006.01)
*F02D 41/24*   (2006.01)

(52) U.S. Cl.
CPC .......... *G01R 31/327* (2013.01); *F02D 41/20* (2013.01); *F02D 41/247* (2013.01); *F02D 41/2438* (2013.01)

(58) Field of Classification Search
CPC ..... G01R 31/327; F02D 41/20; F02D 41/247; F02D 41/2438; F02D 2041/2058; F02M 51/06
See application file for complete search history.

(56) References Cited

U.S. PATENT DOCUMENTS 4,258,674 A * 3/1981 Wolff .................. F02M 47/025
                                                  123/446
4,701,660 A * 10/1987 Baumgartner et al. ....... 310/338
(Continued)

FOREIGN PATENT DOCUMENTS

CN    101326374 A    12/2008
DE    103 43 211     5/2004
(Continued)

OTHER PUBLICATIONS

International Search Report, dated Dec. 28, 2011, issued in corresponding PCT Application No. PCT/EP2011/067782.

*Primary Examiner* — Huy Q Phan
*Assistant Examiner* — David Frederiksen
(74) *Attorney, Agent, or Firm* — Norton Rose Fulbright US LLP; Gerard Messina

(57) ABSTRACT

A method is described for operating at least one magnetic switching element, at least one first connection of at least one sensor device being connected to at least one connection of a coil of the magnetic switching element, and the first connection or an additional connection of the sensor device being connected to a reference potential, and a measuring state being established in which at least one connection of the coil is essentially at least temporarily decoupled from the reference potential and/or from a source activating the coil, and at least one signal of at least one sensor of the sensor device being ascertained in the measuring state from at least one electrical potential at at least one connection of the coil.

17 Claims, 10 Drawing Sheets

(56) References Cited

U.S. PATENT DOCUMENTS

| | | | | |
|---|---|---|---|---|
| 5,890,468 | A | * | 4/1999 | Ozawa ................. F02B 37/005 123/561 |
| 5,895,844 | A | * | 4/1999 | Krueger ..................... 73/114.72 |
| 5,986,871 | A | * | 11/1999 | Forck et al. .................. 361/160 |
| 6,140,717 | A | * | 10/2000 | Fischer ................. F02D 41/20 123/604 |
| 7,401,595 | B2 | * | 7/2008 | Kimura et al. .............. 123/490 |
| 2001/0023616 | A1 | * | 9/2001 | Wade ................. F02M 63/0225 73/756 |
| 2006/0094566 | A1 | * | 5/2006 | Keeler ................. F02D 41/064 477/111 |
| 2006/0107914 | A1 | * | 5/2006 | Dingle ................... F01L 9/021 123/90.12 |
| 2007/0000475 | A1 | * | 1/2007 | Asano .......................... 123/305 |
| 2008/0011275 | A1 | | 1/2008 | Remele et al. |
| 2008/0025849 | A1 | * | 1/2008 | Okamoto ............ F02D 41/3845 417/213 |
| 2009/0045267 | A1 | * | 2/2009 | Sutter ................. F02D 41/2096 239/102.2 |
| 2009/0084357 | A1 | * | 4/2009 | Nakata ................... F02D 41/40 123/458 |
| 2009/0118982 | A1 | * | 5/2009 | Kondo ................ F02M 47/027 701/104 |
| 2009/0177369 | A1 | * | 7/2009 | Miyake et al. ............... 701/105 |
| 2009/0234558 | A1 | * | 9/2009 | Walsh ................. F02D 41/2096 701/103 |
| 2010/0263632 | A1 | * | 10/2010 | Miyake .................. F02D 41/20 123/476 |
| 2011/0023836 | A1 | * | 2/2011 | Verner ................... F02D 41/20 123/490 |

FOREIGN PATENT DOCUMENTS

| | | | |
|---|---|---|---|
| DE | 10 2006 029083 | | 4/2007 |
| DE | 10 2005 060414 | | 6/2007 |
| DE | 10 2006 029082 | | 1/2008 |
| EP | 1 400 674 | | 3/2004 |
| JP | 2004108273 A | * | 4/2004 |
| JP | 2004116523 A | | 4/2004 |

* cited by examiner

METHOD FOR OPERATING A SWITCHING ELEMENT

CROSS REFERENCE TO RELATED APPLICATIONS

The present application is the national stage entry of International Patent Application No. PCT/EP2011/067782, filed on Oct. 12, 2011, which claims priority to Application Nos. DE 10 2010 043 303.9, filed in the Federal Republic of Germany on Nov. 3, 2010, and DE 10 2010 063 681.9, filed in the Federal Republic of Germany on Dec. 21, 2010.

FIELD OF INVENTION

The present invention relates to a method for operating a switching element, as well as to a control and/or regulating device and a fuel injector.

BACKGROUND INFORMATION

Switching elements, such as relays, piezoelectric actuators or solenoid valves—the latter, in particular, in the form of fuel injectors of an internal combustion engine—are subject to strict requirements during operation and are therefore frequently monitored. This monitoring may be carried out, for example, by evaluating voltages and/or currents of an actuator of the switching element, or with the aid of sensors which convert any physical variables into electrical variables. Additional lines are generally required to transmit these variables to a control unit or the like, which results in increased complexity.

In solenoid valves for direct gasoline injection of internal combustion engines, electrical control variables of the magnetic circuit may be used in many cases to ascertain the closing point in time of a nozzle needle of a fuel injector when the magnetic circuit directly activates the nozzle needle. Additional measuring lines or the like are frequently unnecessary. In contrast—for example for diesel injection—designs of fuel injectors exist in which the magnetic circuit first activates a servo valve, which subsequently controls a high pressure hydraulic system which activates the nozzle needle. The closing point in time of the nozzle needle is not ascertainable from the movement of a solenoid armature of the solenoid valve.

SUMMARY

An object of the present invention is achieved by a method for operating a switching element as well as by an electrical circuit and a control and/or regulating device and a fuel injector.

The present invention is directed to the finding that a switching element may, in principle, have an energized and a de-energized state. In the energized state, the behavior of the switching element is essentially determined by a voltage applied to an actuator or by the current flowing in the actuator, while in the de-energized state, the behavior of the switching element is determined, for example, by the action of a restoring spring. The control lines of the actuator therefore have no function during the de-energized state.

In the de-energized state of the actuator, the connections thereof, according to the present invention, are essentially temporarily decoupled from an activating source and also advantageously from a reference potential; the actuator is therefore disconnected. The control lines permanently connected to the actuator are therefore available—as explained further below—for the purpose of transmitting signals from the actuator in the direction of the source or of an activating circuit (driver circuit) in the measuring state.

The activating source may be a voltage source, a current source or any electrical network which is designed to activate the actuator.

For example, the actuator has two connections and is correspondingly connected to two control lines. A sensor device for detecting physical variables, which is designed, for example, as a two-terminal network, is permanently connectable to only one connection or to both connections of the actuator and thus to the control lines. If the actuator is decoupled from the activating source at both connections in the measuring state, an electrical potential of the sensor device is ascertainable at the control lines essentially independently of the ohmic resistance of the actuator. In this case, one connection of the sensor device is advantageously connectable to one connection of the actuator, and the other connection of the sensor device is connectable to the reference potential.

Alternatively, if the actuator is decoupled from the activating source or the reference potential at only one connection in the measuring state, both connections of the sensor device are connectable to both connections of the actuator and are thus connected in parallel to the actuator. This alternative may be practical if the impedance of the actuator does not excessively dampen a signal generated by the sensor device, or if a measuring signal generated by the sensor device is still ascertainable despite the parallel-connected actuator.

The actuator may be decoupled from the activating source in that an activating circuit (driver circuit), for example a semiconductor circuit or a relay, is blocking or opens.

In its simplest configuration, the sensor device includes a two-pole sensor and is thus identical to the sensor. However, the sensor may be expanded to include additional elements, for example a series resistor, a series-connected diode or a parallel-connected overvoltage protector, and it thus forms a component group, i.e., an electrical network. The sensor may furthermore be an active or a passive element, i.e., it generates a voltage or a current as a function of a certain physical variable, or it changes a passive electrical parameter or its resistance.

The method according to the present invention has the advantage that the sensor device and the actuator are at least partially electrically connected, so that the signal of the sensor device is ascertainable by evaluating potentials applied to the connections of the actuator in a measuring state. Moreover, an activating circuit in a control and/or regulating device for activating the switching element may remain essentially unchanged compared to previously known designs. If the sensor is an active element, auxiliary voltages or the like are likewise unnecessary for the purpose of ascertaining or evaluating the signal of the sensor.

The present invention furthermore has the advantage that multiple switching elements may also be activated individually in a system, a decoupling between the connections of the actuator or the sensor devices being also carried out according to the present invention in the measuring state—in addition to the decoupling from the activating source and/or the reference potential—without additional control lines or measuring lines being required. If necessary, the signals of the different sensor devices may even be ascertained simultaneously.

In particular, the method provides that control lines which are connected to the connections of the actuator and used outside the measuring state for activating the magnetic switching element are used for the purpose of transmitting the at least one electrical potential to an evaluating circuit. This advantageously achieves the fact that the signal of the sensor device—which is advantageously situated on the switching element or on a device activated thereby—is ascertainable without the use of additional measuring lines or the like. Moreover, the associated evaluating circuit may also be situated spatially adjacent to the activating source or the activating circuit. As a result, substantial costs may be saved and the wiring simplified.

The present invention is particularly useful if the switching element is a servo valve of an fuel injector of an internal combustion engine, or if it belongs thereto, and if a variable which characterizes a pressure prevailing in a hydraulic control chamber or a pressure prevailing in a hydraulic valve chamber or a pressure change is ascertained from the signal of the sensor, and if an opening and/or closing point in time of a valve element of the fuel injector is, in turn, ascertained from the variable. The ascertainment of the opening and/or closing point in time, which is important for operating the fuel injector, may thus be carried out over the existing control lines of the actuator without having to install additional measuring lines and without seals and the like being required. An important variable characterizing the operation of the fuel injector is therefor ascertainable without considerable complexity being required for this purpose.

It is furthermore provided that the switching element is activated by the source in a first phase, the activating source is then decoupled from the actuator in a second phase, and the measuring state is established in a third phase. As a result, the method may be carried out in steps, the duration of the particular steps being selectable as a function of the particular parameters characterizing the operation of the magnetic switching element. Likewise, the method may be effectively applied to periodic operations, in particular to the short cycles during operation of fuel injectors. The present invention furthermore takes into account the fact that the operation of an actuator may include not only the actual activation but also additional switching operations, for example an extinction of a current flowing through the actuator. Not only are corresponding switching elements frequently available in the activating circuit or may be easily added for the purpose of essentially decoupling at least one connection of the actuator from the source activating the actuator or from the reference potential, according to the present invention, but the current flowing through the actuator may also quickly subside after the end of the activation with the aid of a rapid extinction system for the purpose of inducing the measuring state.

This results in a plurality of options for applying the present invention. In the first phase, the activation may be carried out, for example, continuously, or it may be pulsed in the manner of a pulse width control system or a two-point power regulating system. In the second phase, the activating source is decoupled from the actuator, and a residual energy present in the actuator may subside with the aid of electrical switching elements, or a period of time may be allowed to elapse during which the residual energy subsides due to losses in the magnetic circuit itself. In the third phase, the measuring state may be established, for example by activating the evaluating circuit.

According to the present invention, it is also possible to start the third phase as early as when the residual energy of the actuator has not yet fully subsided and voltages or potentials resulting therefrom at the connections of the actuator are superimposed on the potentials generated by the sensor device. If necessary, other influences, for example interference suppression capacitors connected to the control lines, may likewise change a time progression of the potentials. In such cases, the function of the evaluating circuit is to adequately distinguish the desired signals of the sensor device from the interfering, superimposed voltages or influences. Common methods for doing this are known from the related art.

One exemplary embodiment of the method provides for the fact that at least two switching elements are operated, and a particular first connection of the actuator of the switching elements is activated by a switching device shared by the switching elements, and a particular second connection of the actuators of the switching elements is activated by an individual switching device for the switching elements, and the shared switching device and/or at least one of the individual switching devices is/are switched to a blocking state. As a result, multiple switching elements may be operated by the method, the actuators being activated at both connections. It is sufficient to activate a particular first connection of the actuators together, the first connections being connected or connectable to each other and connected, for example, to an activating source via a shared switch. The particular second connections of the actuators may be connected, for example, to ground independently of each other via individual switches. In this way, multiple switching elements may be advantageously activated individually using a comparatively small number of switching means, the measuring state still being established in a defined manner. This is accomplished by the fact that the shared switch and/or at least one of the individual switches is/are switched to a blocking state. This means that, in the measuring state, the switches have a sufficiently high and generally negligible impedance in relation to the actuators and the sensor devices connected thereto.

To carry out the method, the present invention proposes an electrical circuit for operating at least one switching element, the at least one sensor device being connected to at least one connection of the actuator, and the electrical circuit being designed to establish a measuring state in which at least one connection of the actuator is essentially at least temporarily decoupled from a reference potential and/or a source activating the actuator, and the electrical circuit being furthermore designed to ascertain, in the measuring state, at least one signal of at least one sensor from at least one electrical potential at the connections of the actuator. A plurality of advantageous exemplary embodiments is therefore described for carrying out the method.

The present invention furthermore takes into account that the sensor device or the sensor included therein may be an active or a passive element. If the sensor is an active element, i.e., if it generates a voltage or a current, for example a piezoelectric element, the evaluating circuit may directly measure or ascertain this signal—if necessary, taking additional conditions such as a time window into account. Alternatively, if the sensor is a passive element, i.e., if it changes, for example, its ohmic resistance or its capacitance as a function of a certain physical variable, it may be necessary to detect or ascertain the ohmic resistance or the capacitance with the aid of additional electrical components. In the simplest case, a DC voltage source and a series resistor or also an oscillating circuit may be used for this purpose.

It is additionally provided that the sensor device is a force-sensitive transducer. The sensor device or the sensor included therein is thus particularly suitable for detecting mechanical variables such as forces, pressures or accelerations, which may occur in fuel injectors.

Another exemplary embodiment of the present invention provides that the force-sensitive transducer is a piezoelectric element. A technically proven component may thus be advantageously used, which operates actively and is therefore able to generate a voltage or a voltage pulse when a force is applied to the component, or which emits a charge or a charge pulse in an appropriate configuration.

One exemplary embodiment of the electrical circuit provides that at least two switching elements are operated, and a particular first connection of the actuators of the at least two switching elements is activatable by a shared switching device, and a particular second connection of the actuators of the at least two switching elements is activatable by an individual switching device, the second connections being connected to the individual switching devices via a second set of control lines. The actuators are activated particularly efficiently thereby, since the particular first connections are connected to each other and may also be activated together by the shared switching device.

In the particular basic configuration of the exemplary embodiment thus described, the particular first connections are connectable via individual control lines, which are only connected to each other in the electrical circuit. Alternatively, it is conceivable to route the first connections of the actuators to the electrical circuit via a shared control line.

Another exemplary embodiment of the electrical circuit, which builds upon this basic configuration, provides that the first connections of the actuators are each connected to the shared switching device via a first set of control lines and via first individual rectifiers which are connected in series to the first set of control lines. As a result, the first connections are decoupled in the measuring state not only from the activating source but also from each other. For example, the evaluating circuit may tap the signals at the connecting point between the control lines and the first individual rectifiers. As a result, the signals of the sensor devices connected to the actuators by at least one connection may, if necessary, also be ascertained and evaluated simultaneously by the evaluating circuit.

Another exemplary embodiment of the electrical circuit additionally provides that the first connections of the actuator are each connectable to a first DC voltage source via the first set of control lines and via the first individual rectifiers which are connected in series to the first set of control lines and via a shared first switch of the shared switching device, and that the first connections of the actuators are also each connectable to a second DC voltage source via the first set of control lines and via second individual rectifiers which are connected in series to the first set of control lines and via a shared second switch of the shared switching device. This makes it possible to feed current (generally individually) to the actuators, the first DC voltage source having, for example, a so-called boost voltage, and the second DC voltage source subsequently having, for example, a battery voltage. According to the present invention, the actuators are also decoupled from each other in the measuring state due to the rectifiers. It is furthermore advantageous that the number of rectifiers provided in the current path is minimized, which makes it possible to reduce the power loss and lower costs.

Another exemplary embodiment of the electrical circuit additionally provides that the first connections of the actuators are also each connected to the reference potential or a ground via the first set of control lines and via third individual rectifiers which are connected in series to the first set of control lines, and the second connections of the actuators are each connected to the first DC voltage source via the second set of control lines and via fourth individual rectifiers which are connected in series to the second set of control lines. This achieves the fact that residual energy which is present in each case subsides at the end of the current-feed to one or multiple of the actuators and may be supplied to the first activating source, only two rectifier sections being included in the circuit being created. As a result, the residual energy may be used with particularly few losses, and the necessary decoupling may still be achieved in the measuring state.

The present invention furthermore proposes a fuel injector which includes a sensor device having at least one sensor, the sensor device being designed to detect a force and/or a pressure of a fluid and/or a structure-borne noise, and a first connection of the sensor device or the sensor being connected to a connection of an actuator of a switching element of the fuel injector, and another connection of the sensor device being electrically conductively connected to at least one electrically conductive section of a housing of the fuel injector. In particular, it is provided that the additional connection of the sensor device or the sensor is connected to a reference potential within the housing of the fuel injector. This creates a compact unit which includes the fuel injector and the sensor device. The sensor device may, in principle, detect any physical variables which may occur even independently of the fuel injector or outside its housing, for example a temperature. If the sensor device is to detect variables which are associated with the operation of the fuel injector, it is advantageous to situate the sensor device within the housing and to connect one connection of the sensor to a reference potential—for example the chassis ground of a motor vehicle—within the housing. This makes the system particularly robust and insensitive to electromagnetic interference.

In its simplest configuration, the sensor device includes a two-pole sensor, in which case it is identical to the sensor. However, the sensor may be expanded to include additional elements, for example a series resistor, a series-connected diode or a parallel-connected overvoltage protector, and it thus forms a component group, i.e., an electrical network. The sensor may furthermore be an active or a passive element, i.e., it generates a voltage or a current as a function of a certain physical variable, or it changes, for example, its ohmic resistance.

Features which are important for the present invention are furthermore specified in the following drawings; the features may be important for the present invention both alone and in different combinations without explicit reference being made thereto again.

Exemplary embodiments of the present invention are explained below, with reference to the accompanying drawings.

BRIEF DESCRIPTION OF THE DRAWINGS

The same reference numerals are used for functionally equivalent elements and variables in all figures, even in different exemplary embodiments.

DETAILED DESCRIPTION

The switching elements according to the present invention may be implemented as arbitrary switching elements. The switching elements are advantageously designed as magnetic switching elements or as capacitive switching elements. Capacitive switching elements of this type are also referred to as piezoelectric actuators. Coils are used as actuators in magnetic switching elements and capacitors in the form of piezoceramics are used in piezoelectric actuators.

The procedure according to the present invention is described below based on the example of a magnetic switching element having a coil. However, the procedure according to the present invention may also be used in other actuators, in particular in piezoelectric actuators. The procedure must be adapted accordingly in this case. The coil must thus be replaced with a capacitor. The different properties of a coil and a capacitor must be taken into account. For example, voltages must be evaluated instead of currents.

Figure 1:
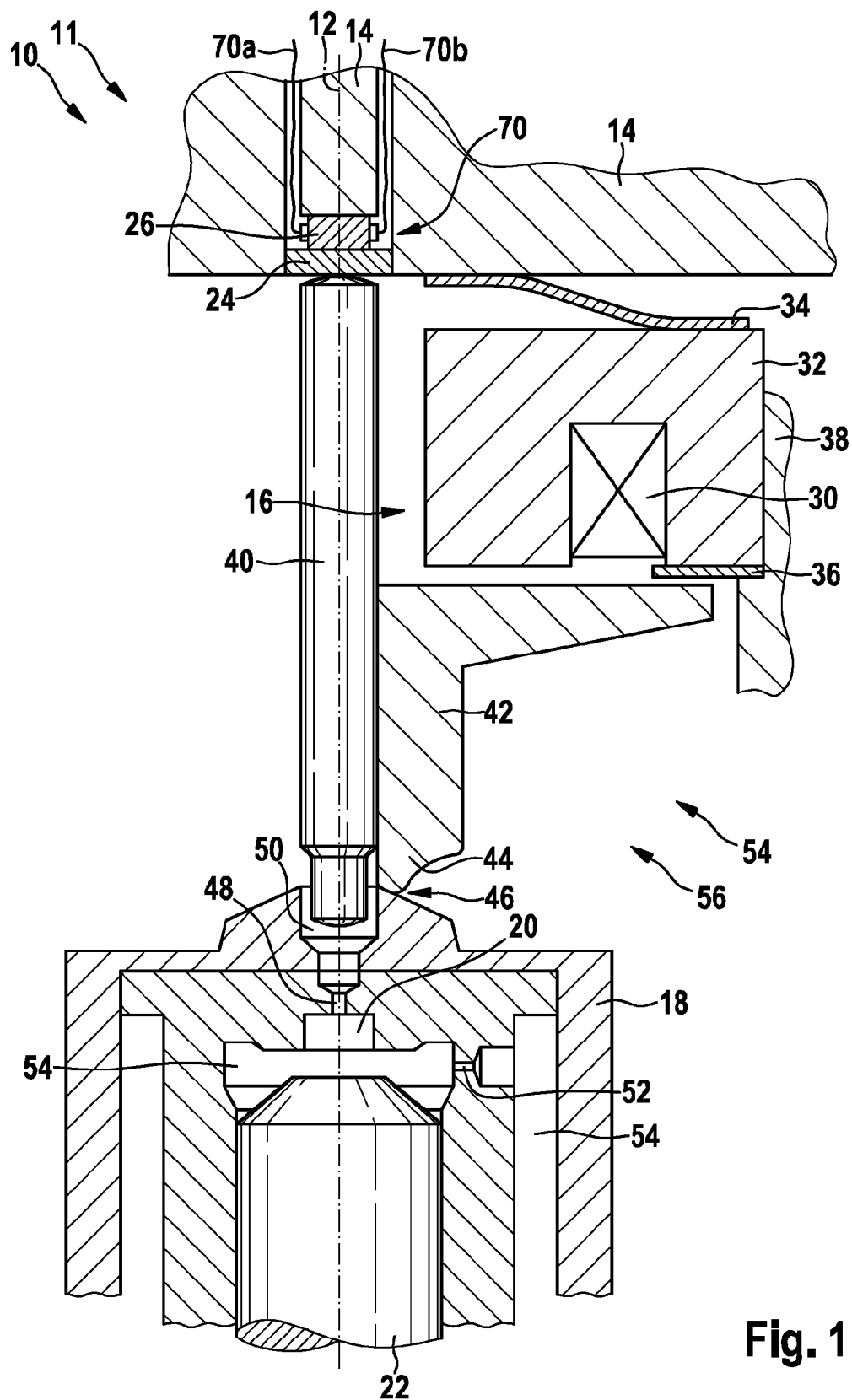
FIG. 1 shows a partial sectional representation of a servo valve of a fuel injector having a magnetic switching element and a valve member.

FIG. 1 shows a partial sectional representation of a servo valve 10 of a fuel injector 11, which is not illustrated in further detail, of an internal combustion engine. Servo valve 10 is designed to be essentially rotationally symmetrical around a longitudinal axis 12. An upper area of the drawing shows a supporting plate 14, which is fixedly anchored to a housing (not illustrated), a vertical middle area shows a magnetic switching element 16, and a lower area shows a valve member 18 fixed in a housing, which has a hydraulic control chamber 20 and a valve piston 22, which acts upon a valve needle (not illustrated) of fuel injector 11 or which is fixedly connected to a valve needle of this type.

In the area of longitudinal axis 12, supporting plate 14 has a support piston 24, to which a force-sensitive transducer 26 is operatively connected. Force-sensitive transducer 26, in turn, is supported on supporting plate 14 in the direction of longitudinal axis 12. Two openings (no reference numerals), through which lines may be guided for contacting connections 70a and 70b of a sensor device 70, are situated above force-sensitive transducer 26 in the drawing. The arrangement of the two openings is illustrated only by way of example in FIG. 1.

Magnetic switching element 16 includes a coil 30, which is embedded in a magnet core 32, magnet core 32 being pressed against an annular armature stop 36 by a cup spring 34. Armature stop 36, in turn, is pressed by cup spring 34 against a diameter step (no reference numeral) of a sleeve 38 fixed in a housing, with the aid of magnet core 32. Along a middle area of longitudinal axis 12, an armature bolt 40, on which an armature 42 is situated movably in the direction of longitudinal axis 12, is mounted with clearance but held radially in place along longitudinal axis 12. A lower end area 44 of armature 42 shown in FIG. 1 may rest on a sealing section 46 of valve member 18 which forms a valve seat. End area 44 thus forms a valve element of servo valve 10. Like the other elements of servo valve 10, magnetic switching element 16 has an essentially rotationally symmetrical design; however, only the right half of a sectional view is shown in the drawing. A guide diameter of armature 42 and a seat diameter in the area of sealing section 46 have approximately the same size.

Valve member 18 delimits hydraulic control chamber 20 and valve piston 22. Valve piston 22 is movable in valve member 18 in the direction of longitudinal axis 12 and, as already mentioned above, it is fixedly coupled with a valve element which is not illustrated (nozzle or valve needle). Above control chamber 20 in the drawing, the control chamber is connected to a valve chamber 50 via an outlet restrictor 48.

An inlet restrictor 52, with the aid of which highly pressurized fluid 54 may be fed into control chamber 20, is situated to the right of control chamber 20 in the drawing. For example, fluid 54 is made available by a common rail fuel system, which is not illustrated. A fluid chamber 56, in which armature 42 and armature bolt 40 are situated, is connected to a low pressure area, which is not illustrated.

As long as coil 30 is not energized, end area 44 is pressed against sealing section 46 by a valve spring, which is not illustrated, and servo valve 10 is thus closed. Due to the pressure conditions in control chamber 20, valve piston 22 in the drawing is pressed downward, so that the valve needle (not illustrated) closes. When coil 30 is energized, armature 42 is moved against armature stop 36 by magnetic force in the direction of magnet core 32. This causes fluid to flow out of control chamber 20 in the direction of fluid chamber 56, so that the pressure in control chamber 20 drops, and the valve needle is able to move up together with valve piston 22 in FIG. 1 and open. The fuel injection begins. For closing, the current-feed to coil 30 is stopped. End area 44 is again pressed against sealing section 46 by the valve spring, servo valve 10 therefore closes, and the outflow of fluid from control chamber 20 is stopped. Since fluid continues to flow via inlet restrictor 52 into control chamber 20, valve piston 22 and, along with it the valve needle, are pressed downward in the closing direction in FIG. 1. The fuel injection stops.

The closing point in time of fuel injector 11 may be ascertained by evaluating the course of the force which armature bolt 40 applies against force-sensitive transducer 26. Due to a force of this type, or due to a change in force, a voltage builds up in the transducer, or a current pulse is generated, or a change in a passive parameter of the sensor takes place, for example a change in its resistance or its capacitance, whereby a sensor signal is generated. The sensor signal may be detected with the aid of electrical circuits, as described below in FIGS. 4 through 11.

Force-sensitive transducer 26 may furthermore be designed as a sensor 26 which alternatively or additionally detects a force and/or a pressure of fluid 54 and/or a structure-borne noise of supporting plate 14 or of a housing of fuel injector 11, so that the opening points in time and/or closing points in time of servo valve 10 are also ascertainable therefrom.

Figure 2:
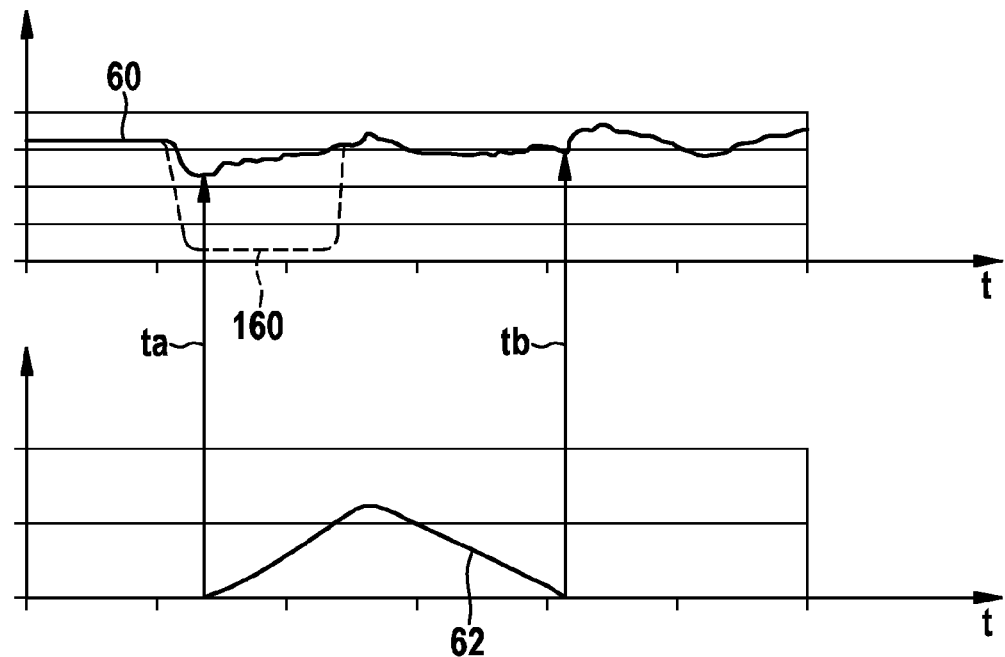
FIG. 2 shows a timing diagram for a control chamber pressure and a lift of a valve element of the servo valve from FIG. 1, designed as a valve needle.

FIG. 2 shows a time correlation between a pressure 160 in valve chamber 50, pressure 60 in control chamber 20 and lift 62 of valve piston 22 or the valve needle connected thereto. In FIG. 2, pressure 60 in control chamber 20 as well as pressure 160 in valve chamber 50 are plotted on the ordinate in an upper diagram, and lift 62 of valve piston 22 is plotted on the ordinate in a lower diagram. Pressure 60 is represented by a solid line, while pressure 160 is represented by a dotted line. In the present case, a lift 62 of zero means a closed fuel injector. Both diagrams have an identical time scale t on the abscissa.

It is apparent that the curve of pressure 60 undergoes clearly visible changes both at the beginning of the opening movement of valve piston 22 at a point in time ta and at the end of the closing movement at a point in time tb. A sudden pressure drop occurs immediately before opening at point in time ta, and a sudden pressure rise occurs during closing at point in time tb. Pressure 160 in valve chamber 50, which is identical to pressure 60 in control chamber 20 when servo valve 10 is closed, acts upon force-sensitive transducer 26 via armature bolt 40, and it may thus be converted into a sensor signal, so that the changes in pressure 160 are mapped in the sensor signal and may thus be evaluated for ascertaining, for example, the closing point in time.

Figure 3:
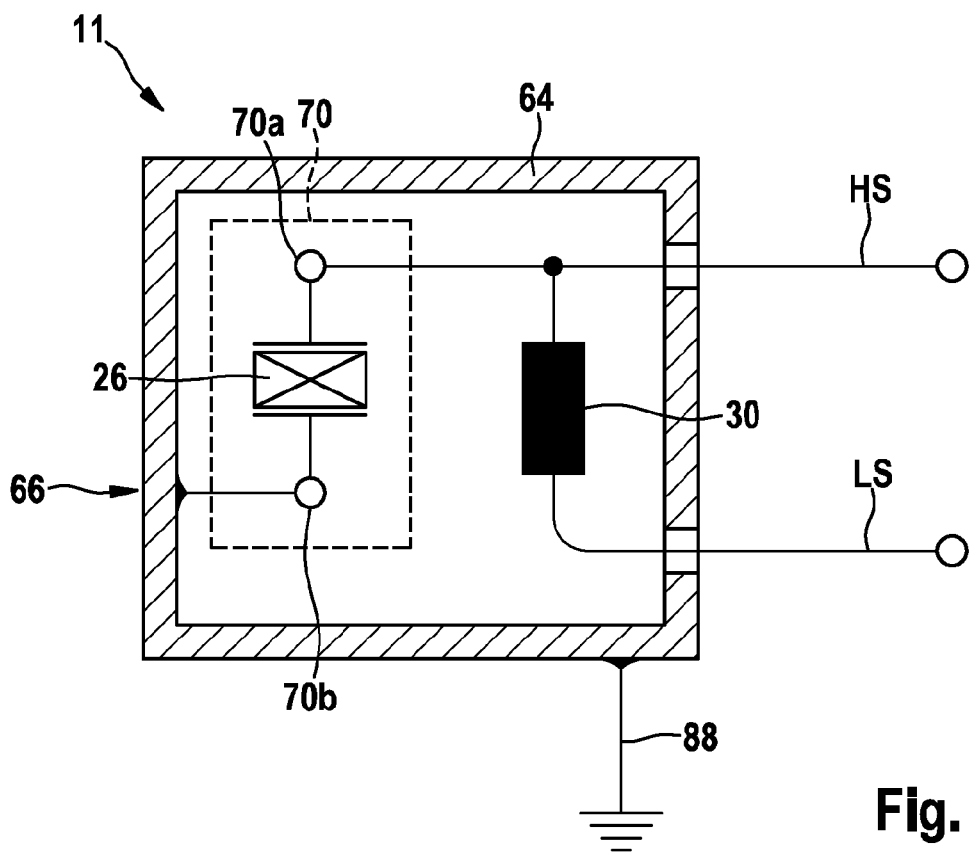
FIG. 3 shows a simplified schematic representation of one exemplary embodiment for the connection of a sensor and a coil in a housing of a fuel injector.

FIG. 3 shows a simplified schematic exemplary embodiment for connecting sensor 26 and coil 30 in a housing 64 of fuel injector 11. In the present case, sensor 26 is a two-pole piezoelectric element and the sole component of a sensor device 70. Connections HS and LS of coil 30 are insulated and led out of housing 64 of fuel injector 11. One connection 70a of sensor 26 or of sensor device 70 is electrically conductively connected to connection HS of coil 30, and another connection 70b of sensor 26 is electrically conductively connected to an electrically conductive section 66 of housing 64 in a low ohmic manner. Housing 64, in turn, is electrically conductively connected to a reference potential 88, which in the present case is a ground potential of a motor vehicle which includes fuel injector 11. This takes place with the aid of the mechanical attachment of fuel injector 11, which is screwed, for example, into an engine block. However, this is not illustrated in the drawing.

In the present case, sensor 26 is a force-sensitive transducer 26 which is situated within housing 64 in a compact manner. According to the representation in FIG. 2, sensor 26 ascertains pressure 160 in valve chamber 50 of servo valve 10. A signal of sensor 26 may be ascertained via connection HS or LS of coil 30 by detecting an electrical potential at connection HS or LS of coil 30. Situating sensor 26 within housing 64 makes the method according to the present invention particularly robust and insensitive to interfering electromagnetic couplings.

Figure 4:
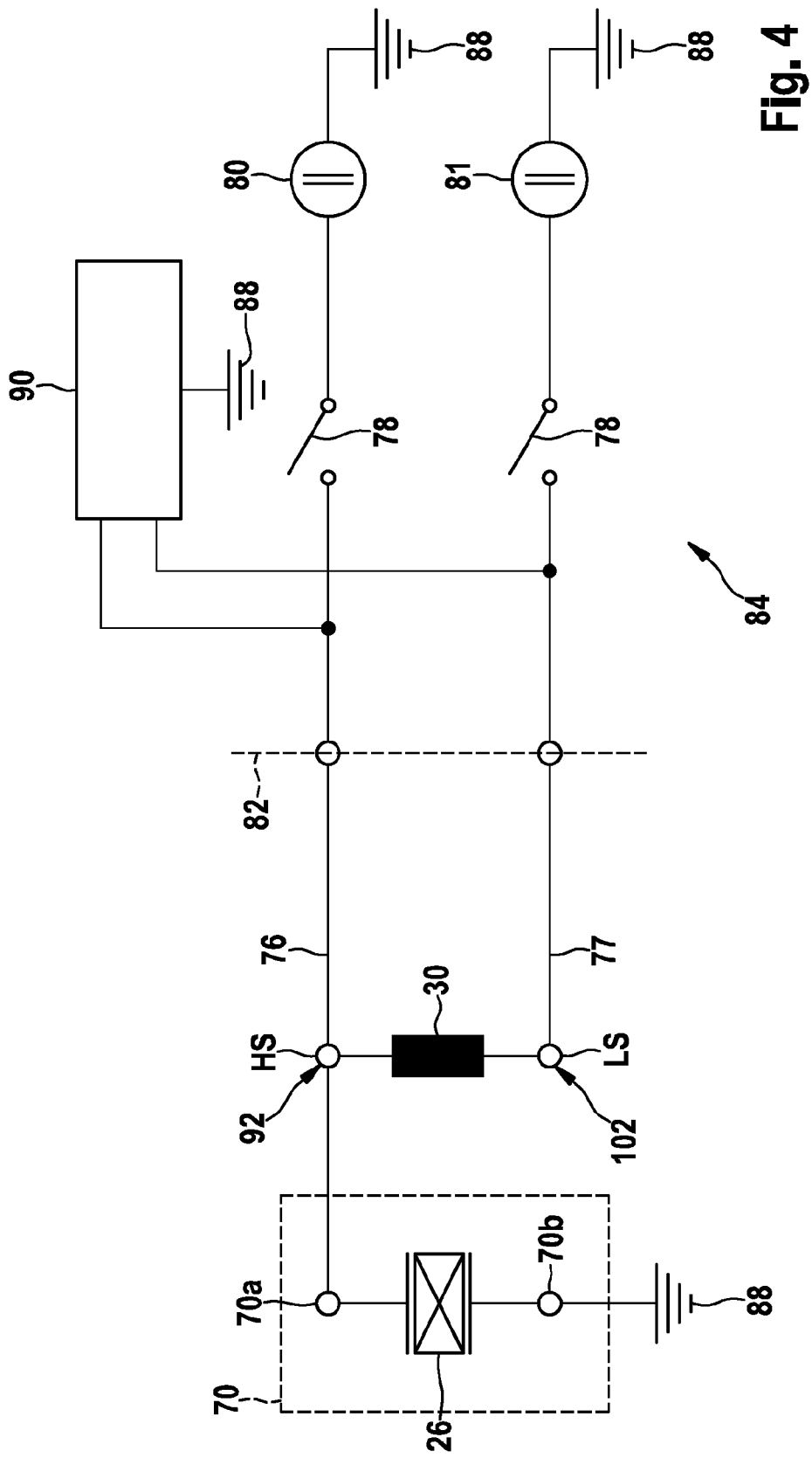
FIG. 4 shows a first representation for carrying out the method.

FIG. 4 shows a first basic representation for carrying out the method. According to FIG. 3, a connection 70a of sensor device 70 or sensor 26 is electrically conductively connected by way of example to connection HS of coil 30. Alternatively, connection 70a of sensor device 70 or sensor 26 may also be connected to connection LS of coil 30. The other connection 70b is electrically conductively connected to reference potential 88. Both connections HS and LS of coil 30 are not connected to reference potential 88. Two control lines 76 and 77 connect connections HS and LS of coil 30 to an activating circuit 78 (driver circuit), which is represented by switch symbols in the drawing of FIG. 4 and which may be designed, for example, as a semiconductor circuit. In the present case, an activating source 80 or 86 is represented by DC voltage sources 80 and 81. In the drawing in FIG. 4, the elements to the right of a vertical dashed line 82 are assigned to a control and/or regulating device (not illustrated in greater detail), and the elements to the left of line 82 are assigned to fuel injector 11 and an engine compartment.

An evaluating circuit 90 detects potentials 92 and 102 applied to control lines 76 and 77 in relation to reference potential 88. Alternatively or additionally, a linear combination of potentials 92 and 102 may also be evaluated between a particular connection HS and LS of coil 30 and reference potential 88.

In a first phase, coil 30 is connected to activating source 80 or 81 with the aid of activating circuit 78, i.e., it is connected in a low ohmic manner to source 80 or 81. The illustrated switches are closed. Coil 30 is therefore energized and servo valve 10 may be placed in a working position.

In a second phase, coil 30 is decoupled from activating source 80 or 81 with the aid of activating circuit 78, i.e., the illustrated switches are opened. The current in coil 30 becomes zero, and servo valve 10 is able to assume an idle position. So-called clamp diodes, which are additionally included in activating circuit 78 and which permit the coil current to continue flowing after switch 78 opens against an extinction voltage, are not illustrated herein.

In a third phase, a measuring state is established by activating evaluating circuit 90. This may be carried out independently of whether and to what extent the residual energy of coil 30 has actually subsided in the preceding second phase. The transition from the second phase to the third phase, therefore, is randomly selectable as needed. Evaluating circuit 90 detects potentials 92 and 102 of control lines 76 and 77 against reference potential 88 for the purpose of ascertaining a voltage signal or current signal generated by sensor device 70 or sensor 26. According to the circuit shown in FIG. 4, it may be sufficient to solely evaluate potential 92 of control line 76 or solely potential 102 of control line 77.

Figure 5:
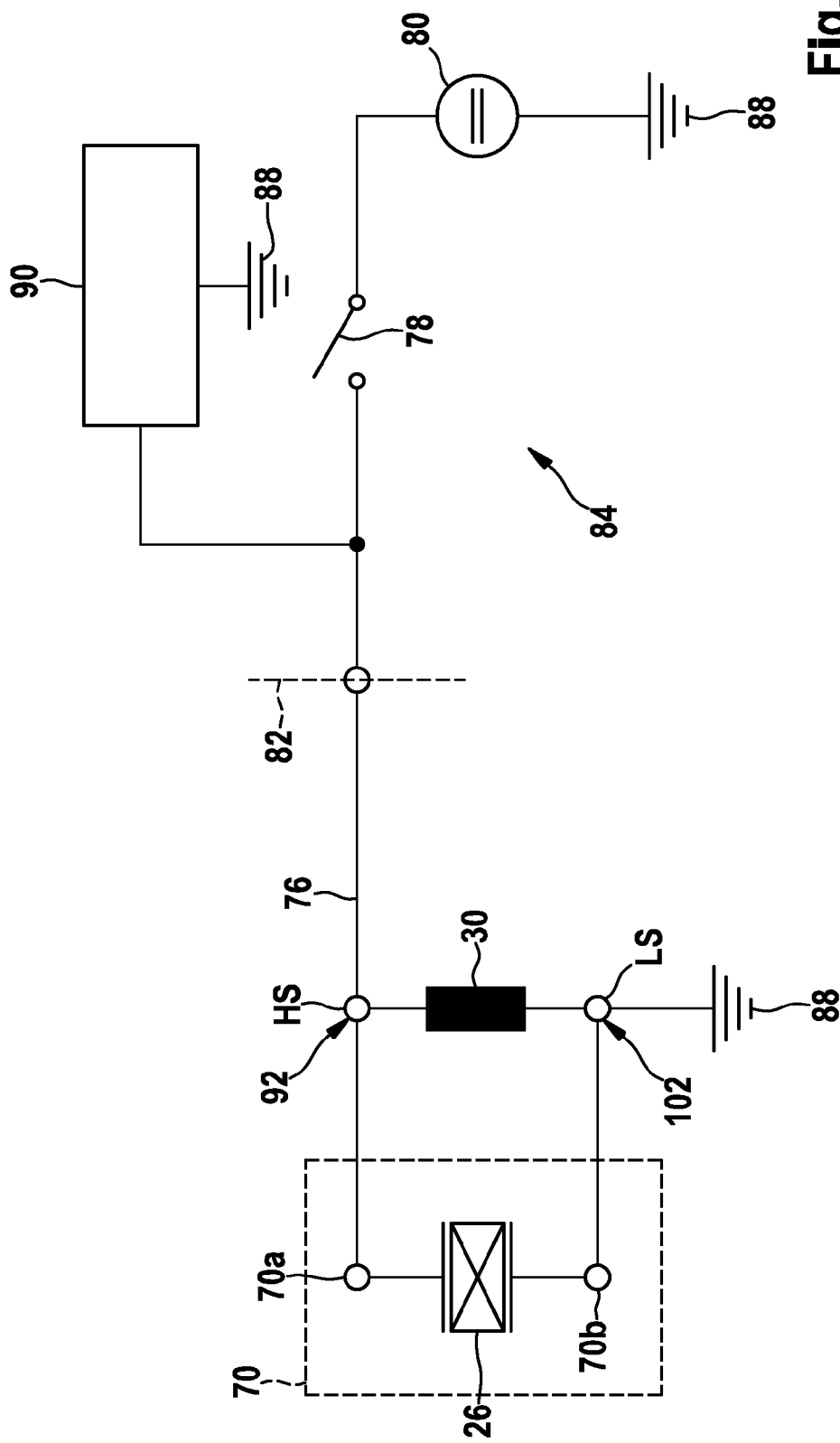
FIG. 5 shows a second representation for carrying out the method.

FIG. 5 shows an alternative system for carrying out the method. In contrast to FIG. 4, sensor device 70 is connected to connections HS and LS of coil 30 by both connections 70a and 70b. Coil 30 is connected to reference potential 88 via connection LS. The current-feed to coil 30 takes place via only one control line 76 and via only one switch of activating circuit 78. In the measuring state, a signal of sensor device 70 or sensor 26 may thus also be ascertained via potential 92 and evaluated in evaluating circuit 90. Due to the parallel connection of sensor 26 and coil 30, potential 92, however, is dependent on the ohmic resistance and inductance of coil 30 and is comparatively low.

Figure 6:
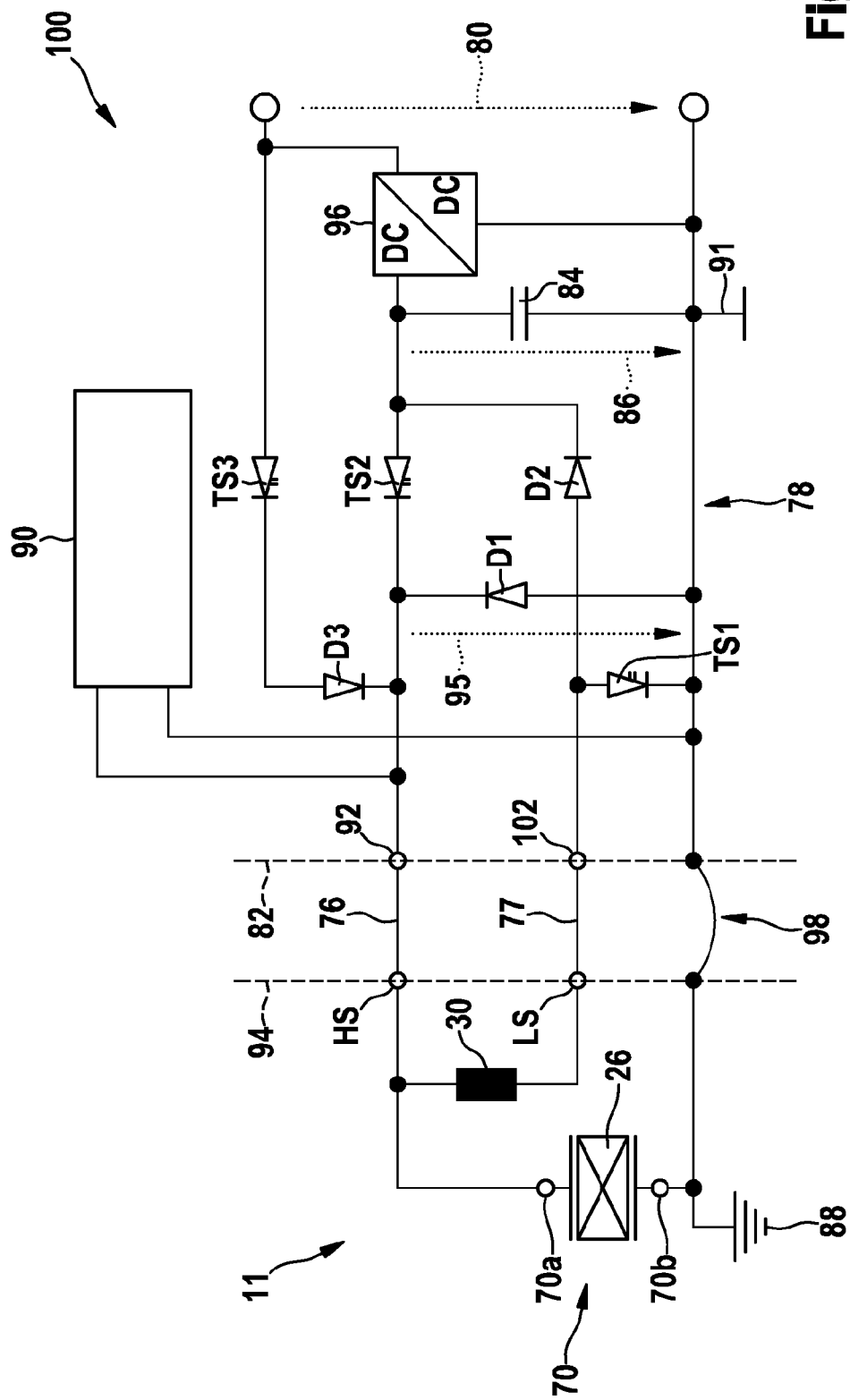
FIG. 6 shows a first exemplary embodiment of an electrical circuit for operating the servo valve from FIG. 1.

FIG. 6 shows a first exemplary embodiment of an electrical circuit 100 for activating coil 30 and for detecting the signals of sensor 26 or force-sensitive transducer 26. Sensor 26 is an active sensor 26, i.e., it generates a voltage or a voltage pulse or a current pulse when a force is applied thereto. Coil 30 has an upper connection HS and a lower connection LS. Sensor 26 is connected to connection HS of coil 30 via connection 70a, and it is connected to reference potential 88 via connection 70b. The space between a vertical dashed line 94 and line 82 represents a cable harness (not drawn explicitly), which includes, among other things, control lines 76 and 77.

The elements situated to the right of line 82 in the drawing are assigned to the control and/or regulating device, as in FIGS. 4 and 5. These elements include activating circuit 78, evaluating circuit 90, voltage 80 of a vehicle battery, which is not illustrated, and a DC/DC converter 96, which is supplied from voltage 80. DC/DC converter 96 generates a voltage 86 at a capacitor 84. This voltage 86 is higher than voltage 80 and represents a so-called boost voltage. Activating circuit 78 from FIG. 6 includes diodes D1, D2 and D3 as well as switches TS1, TS2 and TS3. An arrow 98 symbolizes the connection of reference potential 88 or the vehicle chassis between fuel injector 11 and a ground 91 of the control and/or regulating device. This connection is established in parallel via the body of the vehicle and via a ground line within the cable harness.

Diode D1 is connected as a so-called free-wheeling diode. Diodes D1 through D3 as well as switches TS1 through TS3 are designed as semiconductor elements. Capacitor 84 is dimensioned in such a way that voltage 86 remains approximately constant in all phases of operation and, in the present case, is, as an example, around 48 volts.

In the first phase, coil 30 is energized with the aid of activating circuit 78. For this purpose, switch TS1 connects connection LS of coil 30 to ground 91 via control line 77, the ground being electrically conductively connected to reference potential 88. Switch TS2 is also conductive, so that a current rise corresponding to voltage 86 (boost voltage) occurs in coil 30. Switch TS3 is initially blocked. Once the current in coil 30 has reached a predefined value, switch TS2 is blocked and a pulsed current-feed to coil 30 takes place according to a predefined pattern with the aid of switch TS3.

In the second phase, all three switches TS1 through TS3 are blocked. A so-called rapid extinction of the coil current of coil 30 is subsequently carried out as follows: The coil current flows essentially via connection LS of coil 30, then via diode D2, then via capacitor 84 to ground 91 of the control and/or regulating device, then via diode D1 and then into connection HS of coil 30. Because capacitor 84 has a comparatively high voltage, the output electrical power is comparatively high, and the time until the coil current subsides is therefore short.

In the third phase, the measuring state is induced for the purpose of ascertaining the signal generated by sensor 26 or force-sensitive transducer 26. Switches TS1 through TS3 continue to be blocked in this phase. Evaluating circuit 90 is activated and used in a manner similar to that already described above on the basis of FIGS. 4 and 5. A voltage 95 between control line 76 and ground 91 characterizes the signal of sensor 26. The force acting upon force-sensitive transducer 26 may be determined from the ascertained signal, and pressure 160 prevailing in valve chamber 50 of fuel injector 11 may be determined from the force which is identical to pressure 60 in control chamber 20 when servo valve 10 is closed. Diode D3 may be omitted if switch TS3 provided in series has a corresponding blocking action. In particular, the point in time of a change in the force acting upon force-sensitive transducer 26 may be determined.

Figure 7:
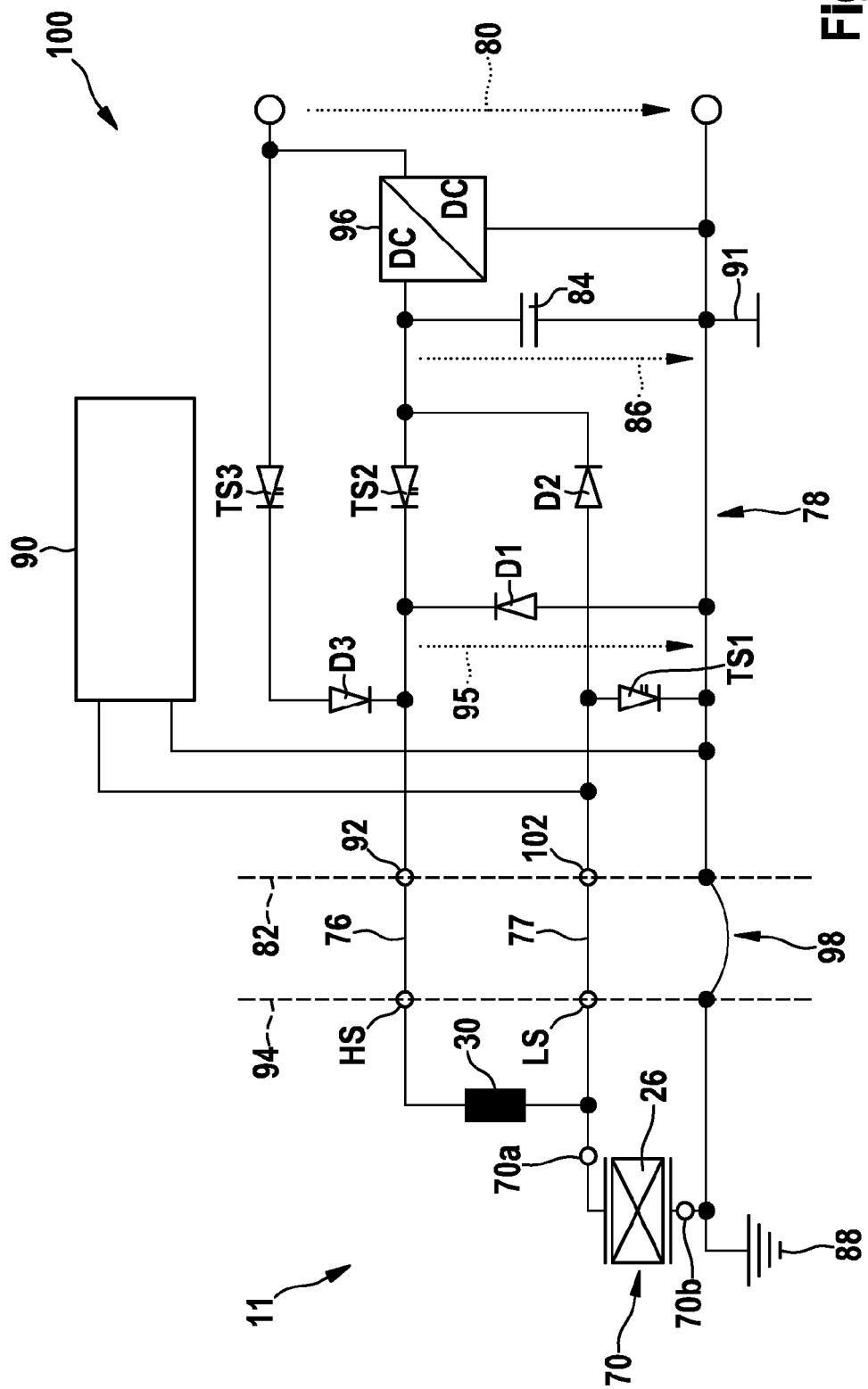
FIG. 7 shows a second exemplary embodiment of an electrical circuit for operating the servo valve from FIG. 1.
Figure 8:
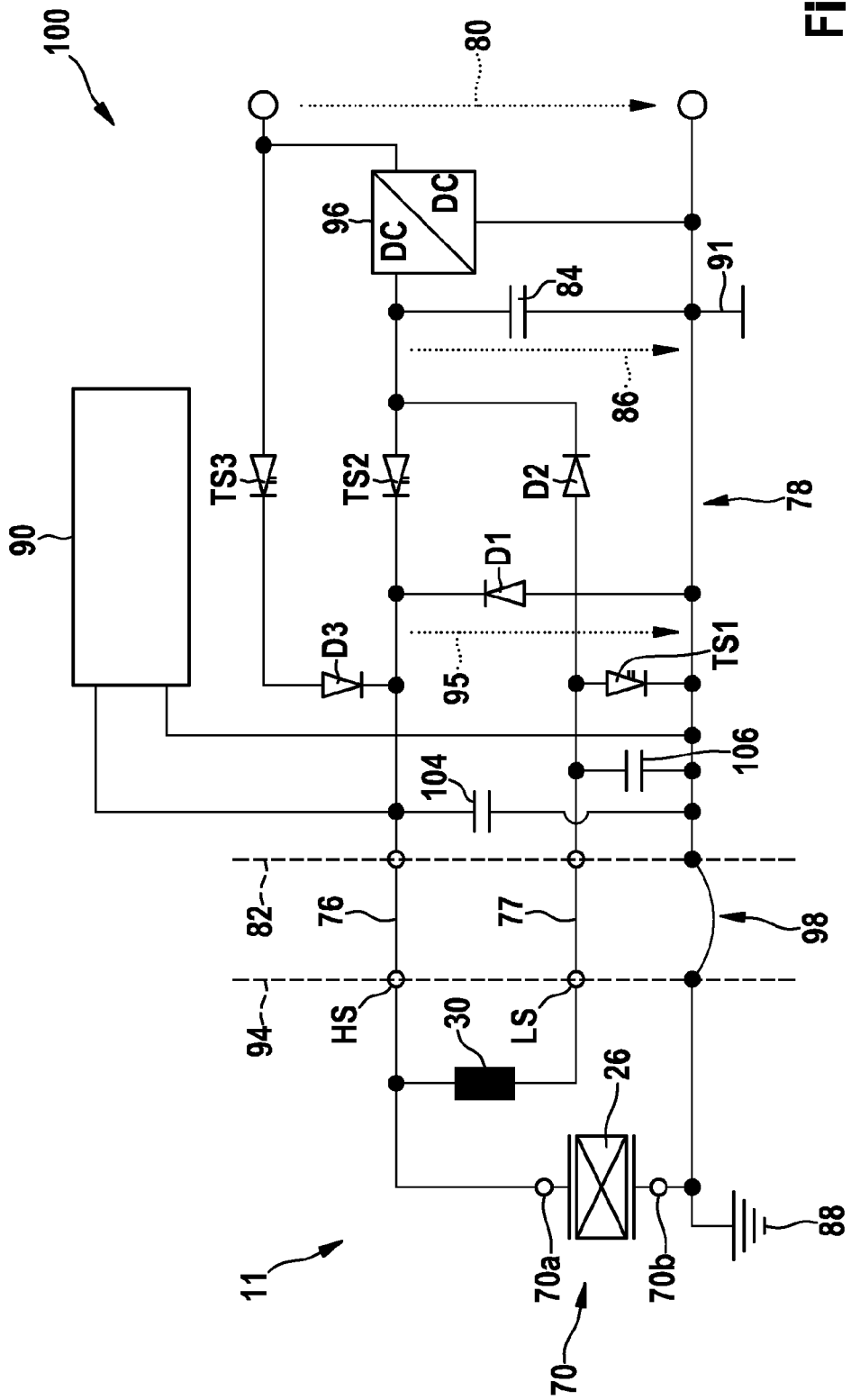
FIG. 8 shows a third exemplary embodiment of an electrical circuit for operating the servo valve from FIG. 1.

It is understood that activating circuit 78 illustrated in FIGS. 6 through 8 is only an example, and the present invention is also applicable to other exemplary embodiments of activating circuit 78, provided that connections HS and LS of coil 30, or control lines 76 and 77 connected thereto, may be decoupled in the measuring state from activating circuit 78 at at least one connection. In addition, the electric control lines required for operating switches "TS" are not illustrated in FIGS. 6 through 8.

FIG. 7 shows an alternative exemplary embodiment of electrical circuit 100. In contrast to FIG. 6, connection 70a of sensor device 70 or sensor 26 is not connected to connection HS but to connection LS of coil 30. Accordingly, evaluating circuit 90 detects potential 102 at control line 77 in reference to ground 91 for the purpose of ascertaining the signal of sensor 26. In addition, the operating mode of electrical circuit 100 in FIG. 7 corresponds to that of FIG. 6, as described above. It is likewise possible to connect connection 70a of sensor device 70 or sensor 26 to connection LS of coil 30 and to still detect potential 92 of control line 76 in reference to ground 91 with the aid of evaluating circuit 90, and vice versa.

The exemplary embodiment of FIG. 8 also essentially corresponds to FIG. 6 described above. In FIG. 8, two capacitors 104 and 106 are additionally connected between transfer points (no reference numerals), situated on line 82, of activating lines 76 and 77 and ground 91 of control and/or regulating device 84.

Capacitors 104 and 106 act as interference suppression capacitors against undesirable electromagnetic radiation and form an electrical load for sensor device 70 as well. Starting in the second phase, in particular, capacitors 104 and 106 determine the time progression of potentials 92 and 102 according to the capacitances of these capacitors. In the present case, evaluating circuit 90 is designed to take into account any residual energy of coil 30 which may still be subsiding and which occurs due to corresponding changes in potentials 92 and 102 as well as the action of capacitors 104 and 106 to the extent that the signal generated by sensor 26—for example, a voltage pulse or an edge in a time progression of potentials 92 and 102—is still sufficiently detectable by evaluating circuit 90.

In addition, it should be noted that it is possible to start the third phase as early as when the residual energy of coil 30 has not yet fully subsided and voltages or potentials 92 or 102 resulting therefrom at connections HS or LS of coil 30 are superimposed on the potentials generated by sensor device 70. The measuring state may thus be selected nearly randomly with regard to time.

In principle, evaluating circuit 90 may even be active during all three phases, i.e., a measuring state may be established and measurements may be carried out. However, potentials 92 and 102 are essentially determined by activating circuit 78 or activating sources 80, 81 and/or 86 in the first phase, a signal of sensor device 70 not being ascertainable or only to a limited extent.

Figure 9:
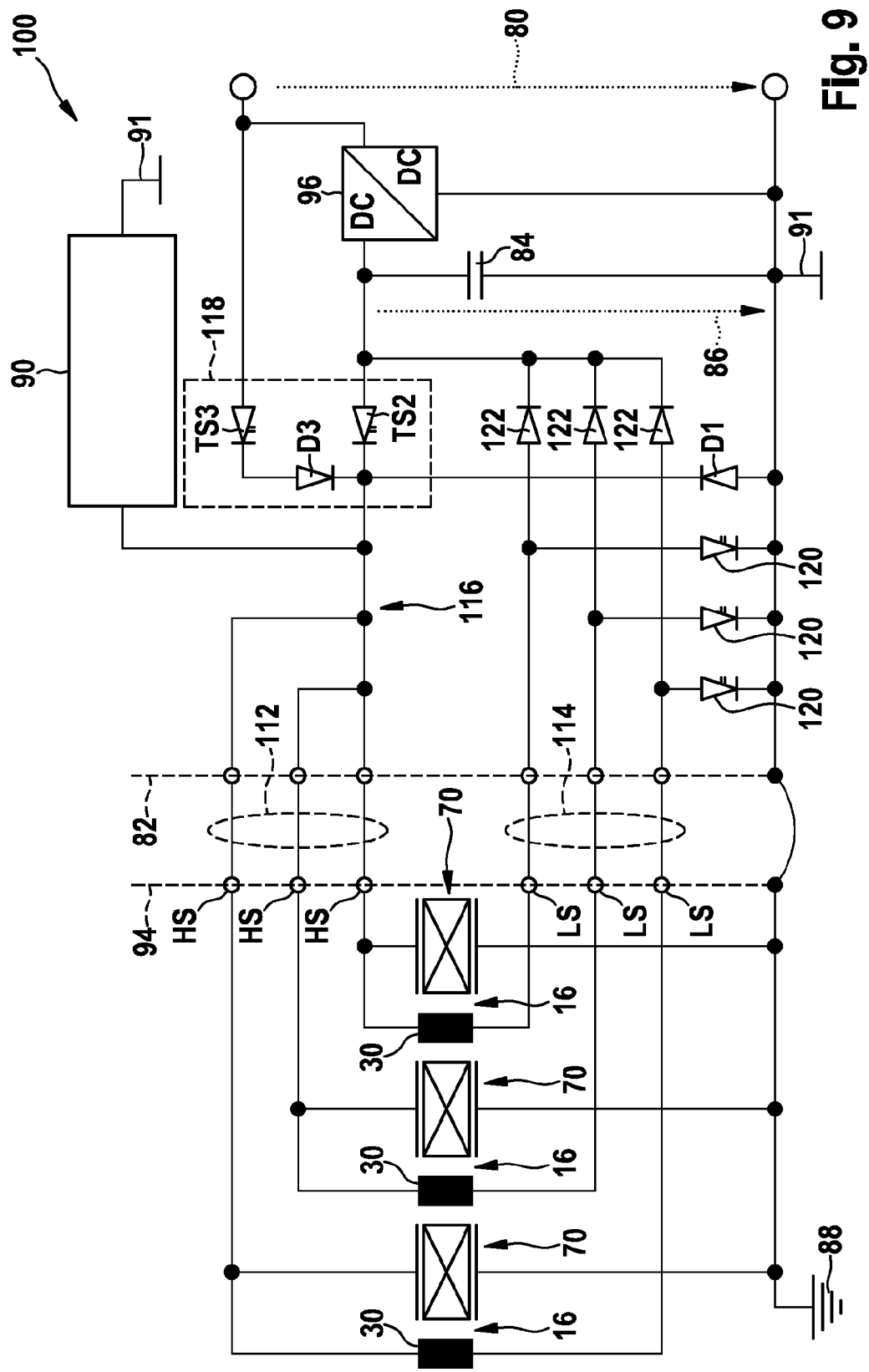
FIG. 9 shows a basic configuration of an electrical circuit for operating multiple magnetic switching elements.

FIG. 9 shows a basic configuration of an electrical circuit 100 for operating multiple magnetic switching elements, which are each assigned, for example, to a fuel injector 11 of an internal combustion engine. Magnetic switching elements 16 and fuel injectors 11 are illustrated to the left of vertical line 94 in the drawing.

The elements of the control and/or regulating device (not illustrated in further detail) are shown to the right of a vertical dashed line 82 in the drawing; the elements between lines 94 and 82 include a first set 112 of control lines and a second set 114 of control lines. First set 112 of control lines and second set 114 of control lines include control lines 76 and 77, respectively, according to FIGS. 6 through 8.

First set 112 of control lines is connected to a node 116 in electrical circuit 100, the node being connected to a shared switching device 118. Shared switching device 118 is able to switch node 116 consecutively to first DC voltage source 86 or second DC voltage source 80. In the present case, first DC voltage source 86 is the boost voltage source, and second DC voltage source 80 is the voltage of the vehicle battery. The boost voltage is generated from the voltage of the vehicle battery with the aid of DC/DC converter 96 and stored in capacitor 84. Evaluating circuit 90 taps the potential applied to node 116 and is able to evaluate this potential in reference to ground 91. In the present case, shared switching device 118 includes switches TS2 and TS3 as well as diode D3.

Second set 114 of control lines is connected to individual switching devices 120 in electrical circuit 100, each of which are able to individually switch second connections LS of coils 30 against reference potential 88 or ground 91. In the present case, individual switching devices 120 each include a switch which is designed as a semiconductor, in a manner comparable to switch TS1 in FIGS. 6 through 8. Second set 114 of control lines is furthermore connected to "fourth" individual rectifiers 122, which are designed as semiconductor diodes and are collectively connected to capacitor 84 at their other connection.

Figure 10:
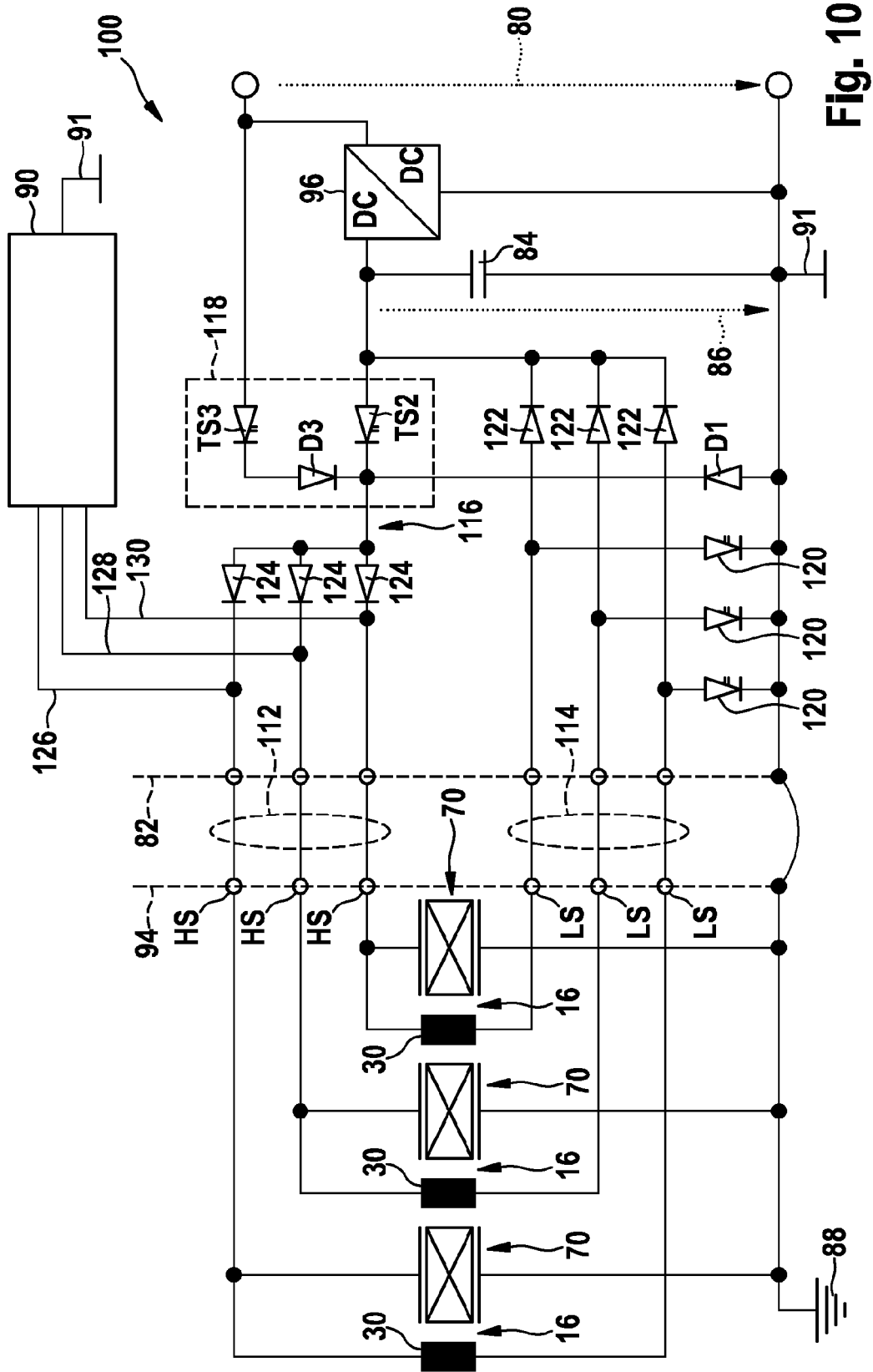
FIG. 10 shows an enhancing exemplary embodiment of the electrical circuit from FIG. 9.
Figure 11:
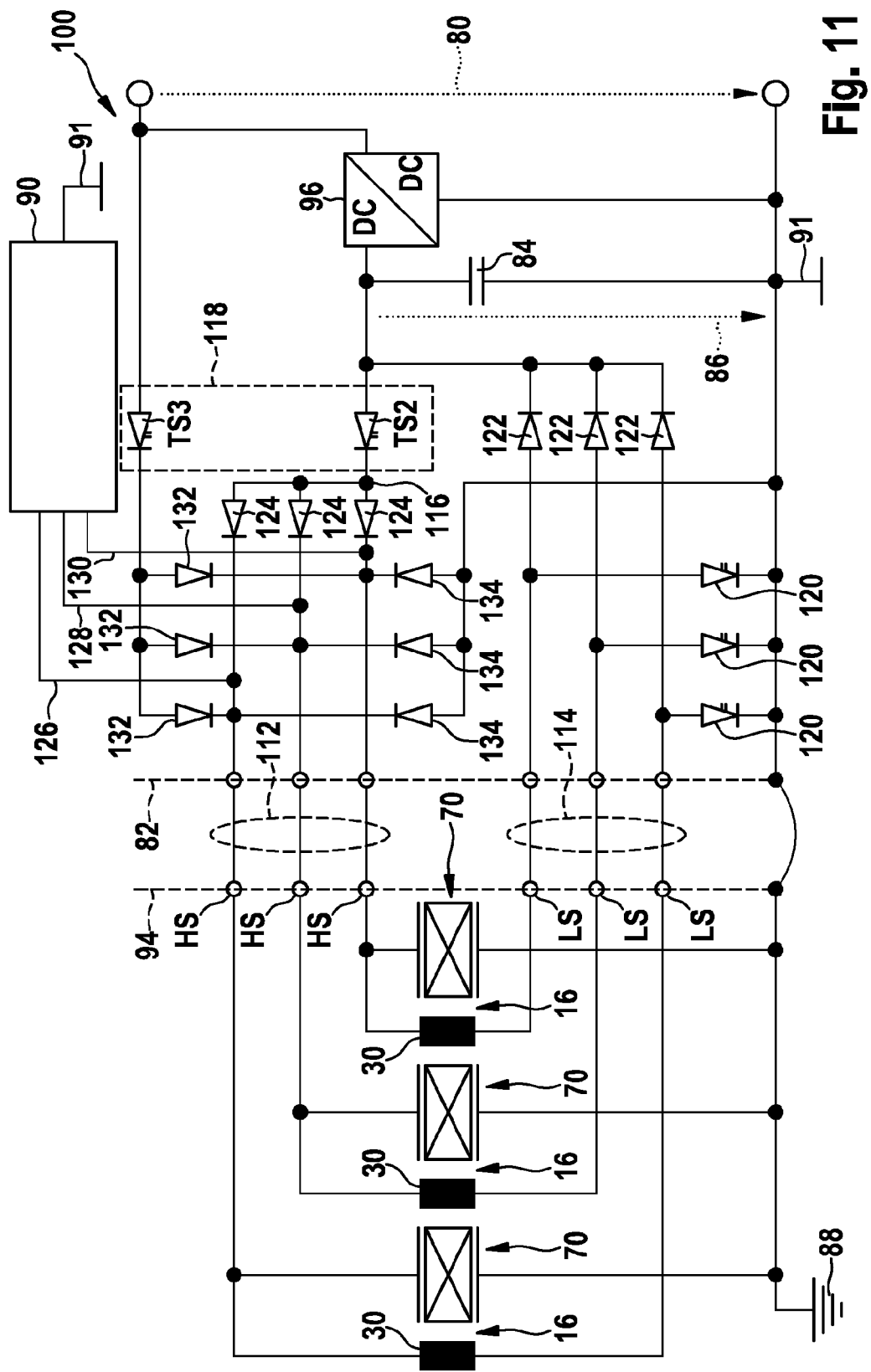
FIG. 11 shows another enhancing exemplary embodiment of the electrical circuit from FIG. 9.

The control lines needed to operate shared switching device 118 or individual switching devices 120 are not illustrated in FIG. 9 or in subsequent FIGS. 10 and 11.

It is apparent that connections HS of coils 30 are connected in parallel to node 116 in FIG. 9. Associated sensor devices 70 are also connected in parallel. Not only are the signals of sensor devices 70 weakened thereby, but an inadvertent overcoupling of the signals between sensor devices 70 may also occur.

The operating mode of electrical circuit 100 may be derived from the function according to FIG. 11, which is described further below. It is understood that the number of three magnetic switching elements 16 illustrated in FIG. 9 and in the subsequent FIGS. 10 and 11 is only an example and may be generally adapted to a number of at least two magnetic switching elements.

FIG. 10 represents an enhancement of the basic configuration illustrated in FIG. 9. In contrast to FIG. 9, the control lines assigned to first set 112 in FIG. 10 are routed via a set of "first" individual rectifiers 124 before being connected to each other at node 116. Evaluating circuit 90 is thus able to tap and evaluate three potentials 126, 128 and 130 corresponding to particular connections HS at first set 112 of control lines.

It is apparent that the signals of the three sensor devices 70 are decoupled from each other by the action of first individual rectifiers 124, and all three individual rectifiers 124 are blocking or may be blocking in the measuring state in addition to switches TS2, TS3 and the three individual switching devices 120. This makes it possible, in particular, to ascertain the closing of fuel injectors 11 individually and particularly accurately. During a current-feed to coils 30, it may be necessary to take into account the voltage drops occurring at individual rectifiers 124, amounting to, for example, 0.7 volts.

FIG. 11 represents an enhancement of FIG. 10. In addition to FIG. 10, electrical circuit 100 of FIG. 11 includes a set of "second" individual rectifiers 132 and a set of "third" individual rectifiers 134, which are connected to first set 112 of control lines—comparable to first individual rectifiers 124.

By way of example, electrical circuit 100 of FIG. 11 may be operated as follows:

In a first step, switch TS2 of shared switching device 118 is put into the conducting state. The potentials at connections HS of coils 30 may assume the approximate value of first DC voltage 86 via first individual rectifiers 124 and first set 112 of control lines. One of the three individual switching devices 120 is likewise put into the conducting state. One of coils 30 illustrated in FIG. 11 is subsequently energized, and particular magnetic switching element 16 is activated, or associated fuel injector 11 is opened.

In a second step, switch TS2 of shared switching device 118 is again put into the blocking state, and switch TS3 is put into the conducting state. The potentials at connections HS of coils 30 may assume the approximate value of second DC voltage 80 via second individual rectifiers 132 and first set 112 of control lines.

In a third step, all switches of shared switching device 118 and individual switching devices 120 are blocked. The current flowing through previously energized coil 30 subsequently subsides continuously according to a specific function, the current taking the following path: via connection LS of coil 30, then via one of fourth individual rectifiers 122, then via capacitor 84, then via ground 91, then via one of third individual rectifiers 134, then via one of control lines from first set 112 of control lines, then via connection HS back to coil 30.

The measuring state is established in a fourth step. The switches of shared switching device 118 and the individual switching devices 120 are blocked. Individual rectifiers 122, 124, 132 and 134 are likewise blocked. Evaluating circuit 90 taps one or multiple of potentials 126, 128 and/or 130 and ascertains at least one signal from one or more of sensor devices 70.

Electrical circuit 100 of FIG. 11 makes it apparent that the signals of sensor devices 70 may be formed, transmitted and ascertained essentially independently of each other due to the use of individual rectifiers 122, 124, 132 and 134, the signals neither weakening each other nor being coupled onto each other in the measuring state—despite the parallel activation by shared switching device 118 during operation of magnetic switching element 16. It is thus even possible to ascertain the signals of the three sensor devices 70 simultaneously.

It is furthermore apparent in FIG. 11 that second individual rectifiers 132 assume the function of diode D3 according to FIGS. 9 and 10. This results in the advantage that only one semiconductor switch and one diode section are situated in each case between activating source 80 and connections HS of coils 30. One diode section is thus eliminated, compared to FIG. 10. The two outputs of shared switching device 118 are thus each connected to connections HS of coils 30 via first individual rectifiers 124 or via second individual rectifiers 132 and via first set 112 of control lines connected in series thereto in each case.

Diode D1, whose function is handled by third individual rectifiers 134 in FIG. 11, is similar to diode D3. After the current-feed is deactivated, the residual energy present in coils 30 is thus advantageously conducted to capacitor 84 via a total of only two diode sections. In comparison to FIG. 9, the diode section of first individual rectifiers 124 is additionally situated in the current path only in the boost phase when coil 30 is energized from the boost voltage of capacitor 84.

Individually, rectifiers 132 or rectifiers 134 in FIG. 11 may have a lower average power loss than diodes D3 or D1 according to FIG. 9. The three individual rectifiers 122 and 124 and 132 and 134 may each be advantageously mounted in a housing or even situated on a semiconductor crystal in a space-saving and cost-effective manner.

What is claimed is:

1. A method for operating at least one switching element, comprising:
    connecting at least one first connection of at least one sensor device to at least one connection of an actuator of the switching element;
    connecting the first connection or another connection of the sensor device to a reference potential;
    establishing a measuring state in which the at least one connection of the actuator is essentially at least temporarily decoupled at least one of (a) from the reference potential and (b) from a source activating the actuator; and
    ascertaining, in the measuring state, at least one signal of at least one sensor of the sensor device from at least one electrical potential at the at least one connection of the actuator;

wherein control lines which are connected to the connections of the actuator and used outside the measuring state for activating the switching element are used in the measuring state for the purpose of transmitting the at least one electrical potential to an evaluating circuit.

2. The method as recited in claim 1, wherein the switching element is a servo valve of a fuel injector of an internal combustion engine or belongs thereto, and a variable which characterizes a pressure prevailing in a hydraulic control chamber or a pressure prevailing in a hydraulic valve chamber or a pressure change is ascertained from the signal of the sensor, and at least one of an opening and closing point in time of a valve element of the fuel injector is, in turn, ascertained from the variable.

3. The method as recited in claim 1, wherein the switching element is activated by the source in a first phase, the source is then decoupled from the actuator in a second phase, and the measuring state is established in a third phase.

4. A method for operating at least two switching elements, the method comprising:
   connecting at least one first connection of at least one sensor device to at least one connection of actuators of the at least two switching elements;
   connecting the first connection or another connection of the sensor device to a reference potential;
   establishing a measuring state in which the at least one connection of the actuators is essentially at least temporarily decoupled at least one of (a) from the reference potential and (b) from a source activating the actuators; and
   ascertaining, in the measuring state, at least one signal of at least one sensor of the sensor device from at least one electrical potential at the at least one connection of the actuators;
   wherein:
     a particular first connection of the actuators of the switching elements is activated by a switching device shared by the switching elements;
     a particular second connection of the actuators of the switching elements is activated by an individual switching device for the switching elements; and
     in the measuring state, at least one of (i) the shared switching device and (ii) at least one of the individual switching devices is switched to a blocking state.

5. An electrical circuit for operating at least one switching element, comprising:
   at least one first connection of at least one sensor device connected to at least one connection of an actuator of the switching element, wherein:
     the first connection or another connection of the sensor device is connected to a reference potential;
     the electrical circuit is configured to:
       establish a measuring state in which the at least one connection of the actuator is essentially at least temporarily decoupled from (a) the reference potential and (b) from a source activating the actuator; and
       ascertain, in the measuring state, at least one signal of the at least one sensor from at least one electrical potential at the at least one connection of the actuator; and
     control lines which are connected to the connections of the actuator and used outside the measuring state for activating the switching element are used in the measuring state for the purpose of transmitting the at least one electrical potential to an evaluating circuit.

6. The electrical circuit as recited in claim 5, wherein the sensor device is able to generate a voltage or a current.

7. The electrical circuit as recited in claim 5, wherein the sensor device is a force-sensitive transducer.

8. The electrical circuit as recited in claim 7, wherein the force-sensitive transducer is a piezoelectric element.

9. The electrical circuit for operating at least two switching elements, the electrical circuit comprising:
   at least one first connection of a sensor device connected to at least one connection of an actuator of the at least two switching elements;
   wherein:
     the first connection or another connection of the sensor device is connected to a reference potential;
     the electrical circuit is configured to:
       establish a measuring state in which the at least one connection of the actuator is essentially at least temporarily decoupled at least one of (a) from the reference potential and (b) from a source activating the actuator; and
       ascertain, in the measuring state, at least one signal of the sensor device from at least one electrical potential at the at least one connection of the actuator;
     a particular first connection of the actuator of the at least two switching elements is activatable by a shared switching device; and
     each of a plurality of second connections of the actuator of the at least two switching elements is activatable by a respective one of a plurality of individual switching devices, the second connections being connected to the individual switching devices via a first set of control lines.

10. The electrical circuit as recited in claim 9, wherein the first connection of the actuators includes a plurality of first connections that are each connected to the shared switching device via a second set of control lines and via first individual rectifiers which are connected in series to the second set of control lines.

11. The electrical circuit as recited in claim 10, wherein the first connections of the actuators are each connectable to a first DC voltage source via the second set of control lines and via the first individual rectifiers connected in series to the second set of control lines and via a shared first switch of the shared switching device, and the first connections of the actuators are also connectable to a second DC voltage source via the second set of control lines and via second individual rectifiers connected in series to the second set of control lines and via a shared second switch of the shared switching device.

12. The electrical circuit as recited in claim 11, wherein the first connections of the actuators are also each connected to the reference potential or a ground via the second set of control lines and via third individual rectifiers connected in series to the second set of control lines, and the second connections of the actuators are each connected to the first DC voltage source via the first set of control lines and via fourth individual rectifiers connected in series to the first set of control lines.

13. A control device configured to carry out a method comprising:
   connecting at least one first connection of at least one sensor device to at least one connection of an actuator of a switching element;
   connecting the first connection or another connection of the sensor device to a reference potential;

establishing a measuring state in which the at least one connection of the actuator is essentially at least temporarily decoupled at least one of (a) from the reference potential and (b) from a source activating the actuator; and ascertaining, in the measuring state, at least one signal of at least one sensor of the sensor device from at least one electrical potential at the at least one connection of the actuator;

wherein control lines which are connected to the connections of the actuator and used outside the measuring state for activating the switching element are used in the measuring state for the purpose of transmitting the at least one electrical potential to an evaluating circuit.

14. A fuel injector, comprising:
a control device;
a switching element including an actuator;
a sensor device that:
  is configured to detect, and produce a measurement signal corresponding to, at least one of a force, a pressure, and a structure-borne noise;
  includes a first connection line that is connected to a connection line of the actuator; and
  includes another connection line that is electrically conductively connected to at least one electrically conductive section of a housing of the fuel injector;
wherein:
  the measurement signal is provided from the first connection line of the sensor device onto the connection line of the actuator;
  the actuator is configured to be powered by a connection of the actuator to a power source over the connection line of the actuator;
  the control device is configured to control a state of the connection of the actuator to the power source to switch between (a) an open state when the measurement signal on the connection line of the actuator is evaluable and (b) a closed state when the measurement signal on the connection line of the actuator is not evaluable.

15. The fuel injector as recited in claim 14, wherein the another connection of the sensor device or the sensor is connected to a reference potential within the housing of the fuel injector.

16. A control device configured to operate an electrical circuit to perform a method comprising:
establishing a measuring state in which at least one connection of an actuator is essentially at least temporarily decoupled from at least one of (a) a reference potential and (b) a source activating the actuator; and ascertaining, in the measuring state, at least one signal of at least one sensor device from at least one electrical potential at the at least one connection of the actuator to which at least one connection of the at least one sensor device is connected;

wherein control lines which are connected to the connections of the actuator and are used outside the measuring state for activating the switching element are used in the measuring state for the purpose of transmitting the at least one electrical potential to an evaluating circuit.

17. A method for operating a switching element, wherein an evaluation device is connected to a first line of an actuator of the switching element, a first line of a sensor device is connected to the first line of the actuator such that a measurement signal produced by the sensor device is placed onto the first line of the actuator, and the first line of the sensor device or a second line of the sensor device is connected to a reference potential, the method comprising:
in a first state, powering the switching element from an electrical source by providing a connection that connects the electrical source to the first line of the actuator, the measurement signal produced by the sensor device not being measurable by the evaluation device based on a signal prevailing on the first line of the actuator due to the connection of the electrical source to the first line of the actuator; and cutting the connection that connects the electrical source to the first line of the actuator, thereby establishing a second state in which (a) the measurement signal produced by the sensor device and placed on the first line of the actuator is measurable by the evaluation device based on the signal prevailing on the first line, and (b) the switching element is not powered by the electrical source.

* * * * *